US012438094B2

(12) United States Patent
Fu et al.

(10) Patent No.: US 12,438,094 B2
(45) Date of Patent: Oct. 7, 2025

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Yi-Min Fu, Taichung (TW); Chi-Ching Ho, Taichung (TW); Chao-Chiang Pu, Taichung (TW); Yu-Po Wang, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 539 days.

(21) Appl. No.: 17/897,523

(22) Filed: Aug. 29, 2022

(65) Prior Publication Data
US 2023/0253331 A1  Aug. 10, 2023

(30) Foreign Application Priority Data
Feb. 9, 2022  (TW) .................................. 111104761

(51) Int. Cl.
H01L 23/538 (2006.01)
H01L 21/56 (2006.01)
(Continued)

(52) U.S. Cl.
CPC ........ *H01L 23/5381* (2013.01); *H01L 21/563* (2013.01); *H01L 21/565* (2013.01);
(Continued)

(58) Field of Classification Search
CPC . H01L 23/5381; H01L 21/563; H01L 21/565; H01L 23/3128; H01L 23/3135; H01L 23/5385; H01L 23/5386; H01L 24/16; H01L 24/32; H01L 24/73; H01L 25/105; H01L 2224/16227; H01L 2224/16235; H01L 2224/16238; H01L 2224/32225; H01L 2224/73204; H01L 2224/73253; H01L 2225/1023; H01L 2225/1041; H01L 2225/107; H01L 2924/182; H01L 2924/3511; H01L 23/5389; H01L 25/03; H01L 25/0652; H01L 21/568; H01L 21/6835; H01L 23/49816; H01L 24/13; H01L 24/24; H01L 24/81; H01L 2221/68345; H01L 2221/68359; H01L 2225/06517; H01L 2225/06524; H01L 2225/06548; H01L 23/16; H01L 23/562
See application file for complete search history.

(56) References Cited

U.S. PATENT DOCUMENTS

2018/0331080 A1*  11/2018  Geissler ................. H01L 25/105
2019/0206813 A1*  7/2019  Kim ........................ H01L 23/12
2023/0154865 A1*  5/2023  Pu .......................... H01L 21/4882
257/668

* cited by examiner

*Primary Examiner* — Marlon T Fletcher
*Assistant Examiner* — Christina A Sylvia
(74) *Attorney, Agent, or Firm* — Studebaker Brackett PLLC

(57) ABSTRACT
An electronic package is provided, in which an electronic module and at least one support member are disposed on a substrate structure having a circuit layer, such that the stress on the substrate structure is dispersed through the at least one support member to eliminate the problem of stress concentration and prevent the substrate structure from warping.

16 Claims, 10 Drawing Sheets

(51) Int. Cl.
  *H01L 23/00* (2006.01)
  *H01L 23/31* (2006.01)
  *H01L 25/10* (2006.01)
(52) U.S. Cl.
  CPC ...... *H01L 23/3128* (2013.01); *H01L 23/3135* (2013.01); *H01L 23/5385* (2013.01); *H01L 23/5386* (2013.01); *H01L 24/16* (2013.01); *H01L 24/32* (2013.01); *H01L 24/73* (2013.01); *H01L 25/105* (2013.01); *H01L 2224/16227* (2013.01); *H01L 2224/16235* (2013.01); *H01L 2224/16238* (2013.01); *H01L 2224/32225* (2013.01); *H01L 2224/73204* (2013.01); *H01L 2224/73253* (2013.01); *H01L 2225/1023* (2013.01); *H01L 2225/1041* (2013.01); *H01L 2225/107* (2013.01); *H01L 2924/182* (2013.01); *H01L 2924/3511* (2013.01)

ELECTRONIC PACKAGE AND MANUFACTURING METHOD THEREOF

BACKGROUND

1. Technical Field

The present disclosure relates to a semiconductor device, and in particular, to an electronic package capable of improving the problem of structural warpage and manufacturing method thereof.

2. Description of Related Art

With the vigorous development of the electronic industry, the electronic products are gradually moving towards the trend of multi-function and high performance. In the current technology of the field of chip packaging, packaging types such as 2.5D packaging process, fan-out routing and embedded bridge (FO-EB) element process, etc. are commonly used, among which, compared with the 2.5D packaging process, FO-EB process has the advantages of low cost and many material suppliers, etc.

FIG. 1 is a schematic cross-sectional view of a conventional FO-EB semiconductor package 1. The semiconductor package 1 is provided with a first semiconductor chip 11 (via an adhesive 12) and a plurality of conductive pillars 13 disposed on a carrier structure 14 having a circuit layer 140. The first semiconductor chip 11 and the conductive pillars 13 are covered by an encapsulation layer 15, and then a circuit structure 10 is formed on the encapsulation layer 15 and electrically connected to the first semiconductor chip 11 and the conductive pillars 13, so that a plurality of second semiconductor chips 16 are disposed on and electrically connected to the circuit structure 10, and the plurality of second semiconductor chips 16 are encapsulated by a packaging layer 18, wherein the circuit layer 140 and the circuit structure 10 are of fan-out redistribution layer (RDL) specification, and the first semiconductor chip 11 is used as a bridge die embedded in the encapsulation layer 15 to electrically bridge two adjacent ones of the second semiconductor chips 16.

The conventional semiconductor package 1 is mainly disposed on a package substrate 1a via a plurality of solder balls 17 with the carrier structure 14, and the conductive pillars 13 are electrically connected to the circuit layer 140, and the package substrate 1a is disposed onto a circuit board (not shown) via solder balls 19.

However, when the conventional semiconductor package 1 is disposed on the package substrate 1a, there are no other elements around it, such that the package substrate 1a is prone to stress unevenness which results in a great warpage, thereby causing reliability problems such as poor ball placement (e.g., the solder balls 19 are dropped and electrically disconnected), etc.

Therefore, there is a need for a solution that addresses the aforementioned shortcomings of the prior art.

SUMMARY

In view of the aforementioned shortcomings of the prior art, the present disclosure provides an electronic package, which comprises: a substrate structure having a circuit layer; an electronic module disposed on the substrate structure and electrically connected to the circuit layer; and at least one support member disposed on the substrate structure and located at a periphery of the electronic module, wherein the at least one support member is electrically connected to the circuit layer.

The present disclosure further provides a method of manufacturing an electronic package, the method comprises: providing an electronic module and at least one support member; and disposing the electronic module and the at least one support member on a substrate structure having a circuit layer, wherein the electronic module is electrically connected to the circuit layer, and wherein the at least one support member is electrically connected to the circuit layer and located at a periphery of the electronic module.

In the aforementioned electronic package and manufacturing method, the at least one support member is an active element.

In the aforementioned electronic package and manufacturing method, the electronic module comprises a first package layer, and a second package layer is formed on the substrate structure to cover the at least one support member and the electronic module, wherein a hardness of the first package layer is greater than a hardness of the second package layer.

In the aforementioned electronic package and manufacturing method, the present disclosure further comprises forming a second package layer on the substrate structure to cover the at least one support member and the electronic module. For example, the at least one support member has a height same as a height of the second package layer. Alternatively, a height of the at least one support member relative to the substrate structure is less than a height of the second package layer relative to the substrate structure.

In the aforementioned electronic package and manufacturing method, a height of the at least one support member relative to the substrate structure is equal to a height of the electronic module relative to the substrate structure.

In the aforementioned electronic package and manufacturing method, a height of the at least one support member relative to the substrate structure is greater than a height of the electronic module relative to the substrate structure.

In the aforementioned electronic package and manufacturing method, a height of the at least one support member relative to the substrate structure is less than a height of the electronic module relative to the substrate structure.

In the aforementioned electronic package and manufacturing method, the electronic module comprises a bridge element, and a plurality of electronic elements are electrically connected to each other via the bridge element.

As can be understood from the above, in the electronic package and manufacturing method thereof according to the present disclosure, the at least one support member is disposed on the substrate structure to disperse the stress on the substrate structure and eliminate the problem of stress concentration. Therefore, compared with the prior art, the electronic package of the present disclosure can prevent the substrate structure from warping.

DETAILED DESCRIPTION

Figure 1:
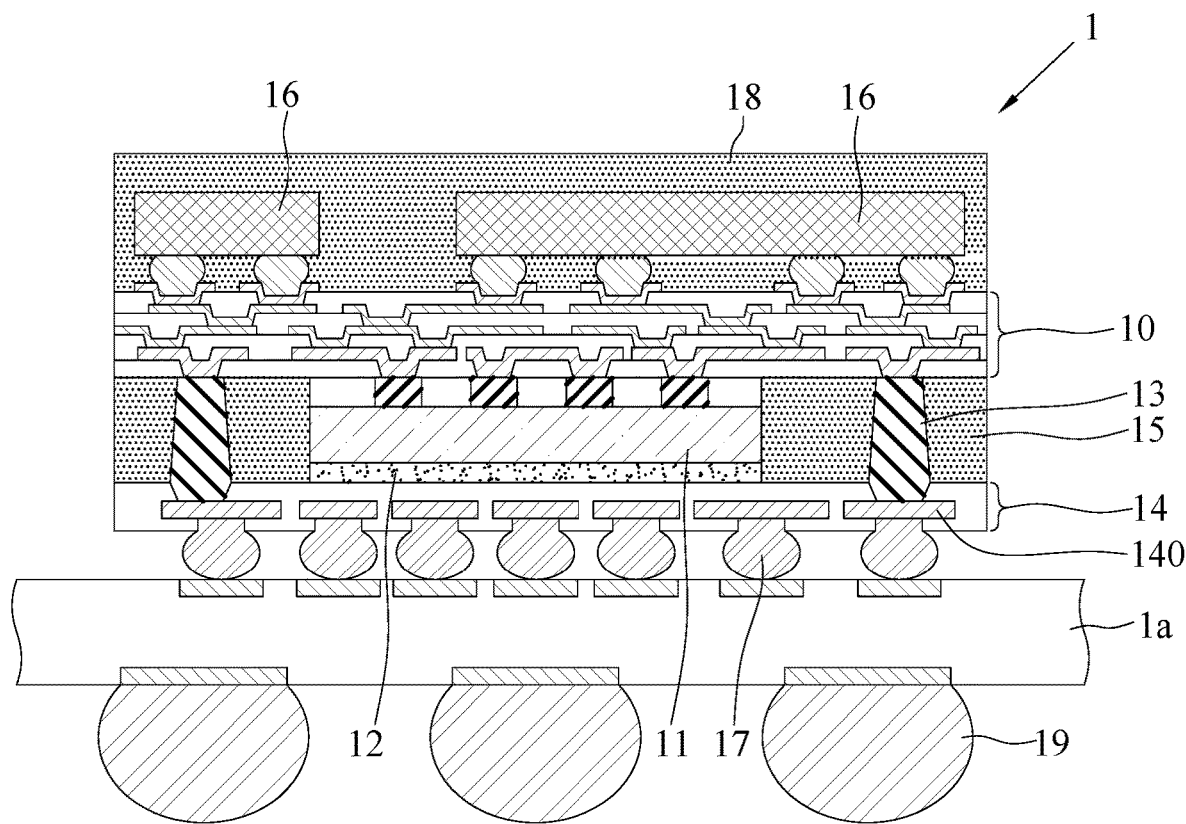
FIG. 1 is a schematic cross-sectional view of a conventional semiconductor package.

Implementations of the present disclosure are described below by embodiments. Other advantages and technical effects of the present disclosure can be readily understood by one of ordinary skill in the art upon reading the disclosure of this specification.

It should be noted that the structures, ratios, sizes shown in the drawings appended to this specification are provided in conjunction with the disclosure of this specification in order to facilitate understanding by those skilled in the art. They are not meant, in any ways, to limit the implementations of the present disclosure, and therefore have no substantial technical meaning. Without influencing the effects created and objectives achieved by the present disclosure, any modifications, changes or adjustments to the structures, ratios or sizes are construed as fall within the scope covered by the technical contents disclosed herein. Meanwhile, terms such as "above," "on," "first," "second," "one," "a," "an," and the like, are for illustrative purposes, and are not meant to limit the scope implementable by the present disclosure. Any changes or adjustments made to the relative relationships, without substantially modifying the technical contents, are also to be construed as within the scope implementable by the present disclosure.

FIG. 2A to FIG. 2H are schematic cross-sectional views illustrating a manufacturing method of an electronic package 2 of the present disclosure.

Figure 2A:
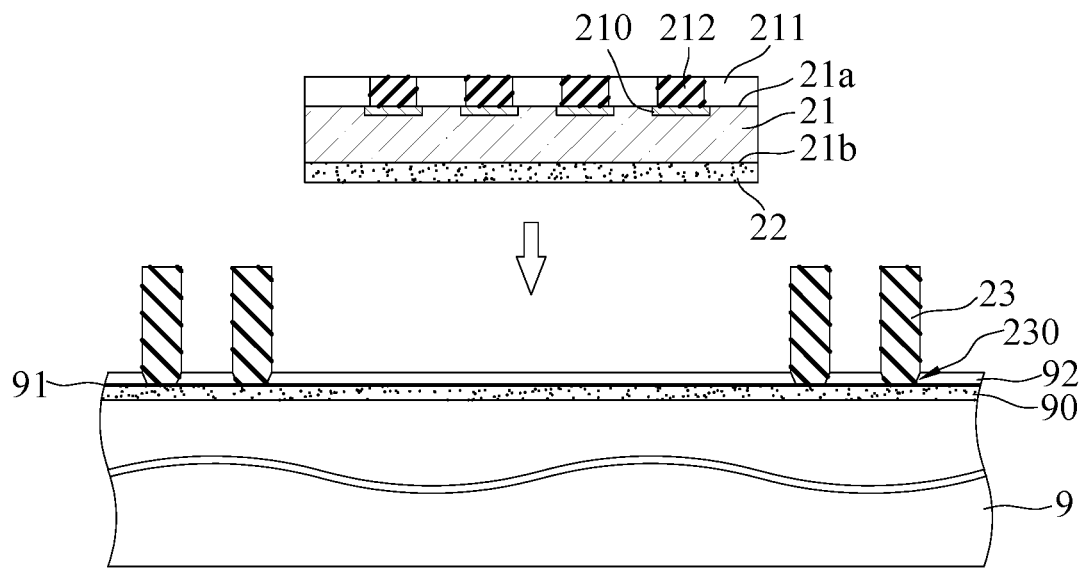
FIG. 2A to FIG. 2H are schematic cross-sectional views illustrating a manufacturing method of an electronic package of the present disclosure.
Figure 2B:
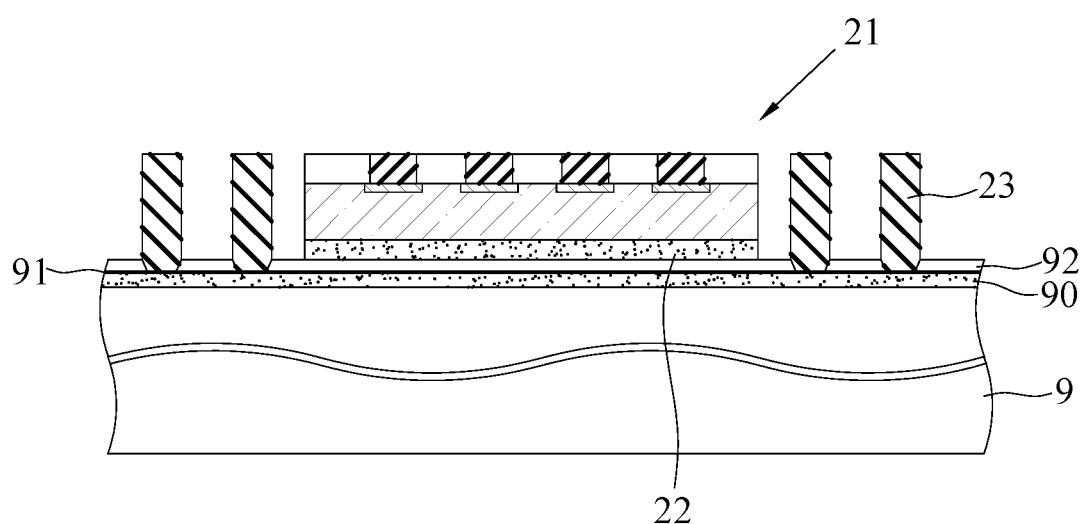

As shown in FIG. 2A and FIG. 2B, at least one first electronic element 21 is disposed on a carrier 9, and a plurality of conductive pillars 23 are formed on the carrier 9.

In an embodiment, the carrier 9 is, for example, a plate of semiconductor material (such as silicon or glass), on which a release layer 90 and a metal layer 91 such as titanium/copper are sequentially formed by, for example, coating, and an insulating layer 92 is formed on the metal layer 91. For example, the material for forming the insulating layer 92 is such as polybenzoxazole (PBO), polyimide (PI), prepreg (PP), or other dielectric materials.

Further, the first electronic element 21 is an active element, a passive element, or a combination of the active element and the passive element, where the active element may be a semiconductor chip, and the passive element may be a resistor, a capacitor, or an inductor. In an embodiment, the first electronic element 21 is a semiconductor chip, which has an active surface 21a and an inactive surface 21b opposing the active surface 21a. The first electronic element 21 is bonded onto the insulating layer 92 by a bonding layer 22 with the inactive surface 21b of the first electronic element 21, and the active surface 21a has a plurality of electrode pads 210 and a protective film 211 such as a passivation material, wherein the plurality of electrode pads 210 are bonded to and electrically connected to a plurality of conductors 212 such as conductive circuits, spherical-shaped solder balls, or column-shaped metal materials (such as copper pillars, solder bumps, etc.), or stud-shaped conductive members made by wire bonding machines, but not limited to the above, so that the conductors 212 are formed in the protective film 211.

In addition, the material for forming the conductive pillars 23 is a metal material such as copper or a solder material, and the conductive pillars 23 are extended through the insulating layer 92 and in contact with the metal layer 91. For example, a plurality of openings 230 exposing the metal layer 91 are formed on the insulating layer 92 in a manner of photolithography, so that the conductive pillars 23 are formed in the openings 230 by electroplating from the metal layer 91.

Figure 2C:
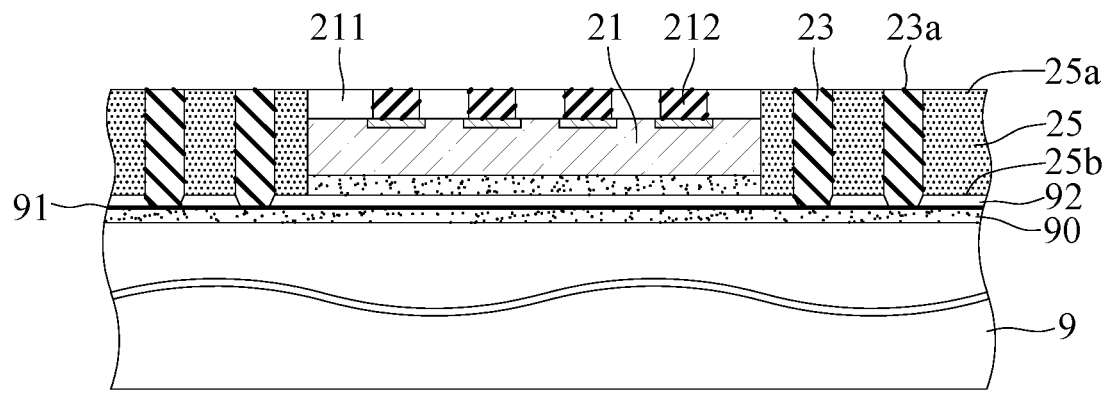

As shown in FIG. 2C, an encapsulation layer 25 is formed on the insulating layer 92 of the carrier 9, so that the encapsulation layer 25 covers the first electronic element 21, the conductors 212 and the conductive pillars 23, wherein the encapsulation layer 25 has a first surface 25a and a second surface 25b opposing the first surface 25a, and an upper surface of the protective film 211, an end surface of each of the conductors 212 and an end surface 23a of each of the conductive pillars 23 are exposed from the first surface 25a of the encapsulation layer 25, and the encapsulation layer 25 is bonded onto the insulating layer 92 of the carrier 9 with the second surface 25b thereof.

In an embodiment, the encapsulation layer 25 is an insulating material, such as polyimide (PI), dry film, encapsulant such as epoxy resin, or molding compound. For example, the encapsulation layer 25 can be formed on the insulating layer 92 by liquid compound, injection, lamination, or compression molding.

Furthermore, the first surface 25a of the encapsulation layer 25 can be flush with the upper surface of the protective film 211, the end surface 23a of each of the conductive pillars 23 and the end surface of each of the conductors 212 by a leveling process, so that the end surface 23a of each of the conductive pillars 23 and the end surface of each of the conductors 212 are exposed from the first surface 25a of the encapsulation layer 25. For example, the leveling process can remove part of the material of the protective film 211, part of the material of the conductive pillars 23, part of the material of the conductors 212 and part of the material of the encapsulation layer 25 by grinding.

Figure 2D:
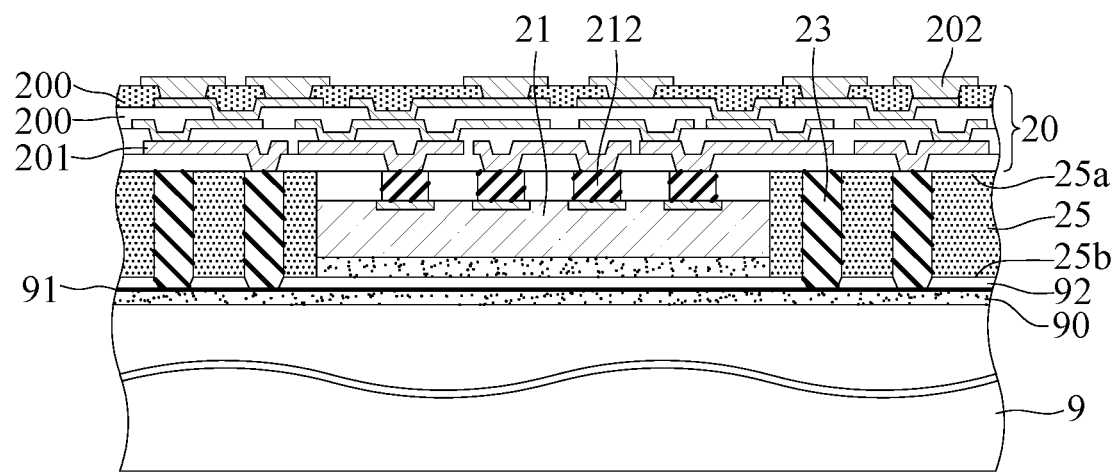

As shown in FIG. 2D, a circuit structure 20 is formed on the first surface 25a of the encapsulation layer 25, and the circuit structure 20 is electrically connected to the plurality of conductive pillars 23 and the plurality of conductors 212.

In an embodiment, the circuit structure 20 comprises at least one dielectric layer 200 and at least one redistribution layer (RDL) 201 disposed on the dielectric layer 200, wherein the outermost dielectric layer 200 can be used as a solder mask, and the outermost redistribution layer 201 is exposed from the solder mask to serve as electrical contact pads 202, such as micro pads (μ-pads). Alternatively, the circuit structure 20 may merely comprise a single dielectric layer 200 and a single redistribution layer 201.

Furthermore, the material for forming the redistribution layer 201 is copper, and the material for forming the dielectric layer 200 is a dielectric material such as polybenzoxazole (PBO), polyimide (PI), prepreg (PP) and the like, or a solder-resist material such as solder mask, graphite, etc.

Figure 2E:
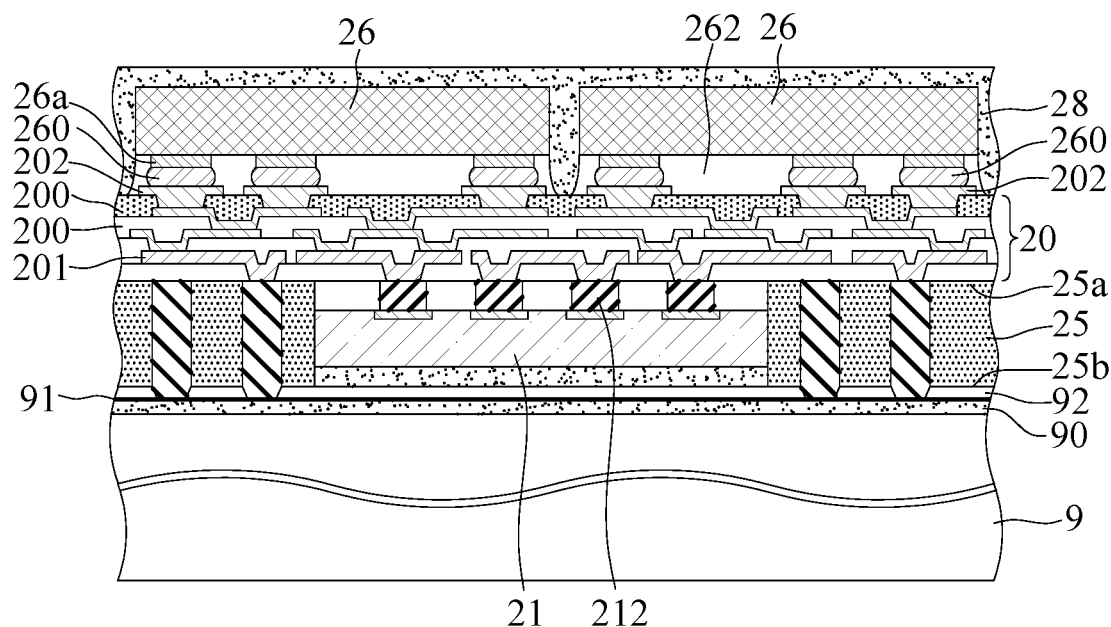

As shown in FIG. 2E, a plurality of second electronic elements 26 are disposed on the circuit structure 20, and then the plurality of second electronic elements 26 are covered by a first package layer 28.

In an embodiment, each of the second electronic elements 26 is an active element, a passive element, or a combination of the active element and the passive element, where the active element may be a semiconductor chip, and the passive element may be a resistor, a capacitor, or an inductor. In one embodiment, each of the second electronic elements 26 is, for example, a semiconductor chip such as a graphics processing unit (GPU), a high bandwidth memory (HBM), etc., but not limited to the above, and the first electronic element 21 is used as a bridge element (a bridge die), which is electrically connected to the circuit structure 20 via the conductors 212 so as to electrically bridge at least two second electronic elements 26.

Furthermore, each of the second electronic elements 26 has a plurality of conductive bumps 26a such as copper pillars to electrically connect to the electrical contact pads 202 via a solder material 260 of a plurality of solder bumps, and the second electronic elements 26 and the conductive bumps 26a are covered by the first package layer 28 simultaneously. In an embodiment, an under bump metallurgy (UBM) layer (not shown) can be formed on the electrical contact pads 202 to facilitate bonding with the conductive bumps 26a.

In addition, the first package layer 28 is an insulating material, such as polyimide (PI), dry film, encapsulant such as epoxy resin, or molding compound, which can be formed on the circuit structure 20 by lamination or molding. It should be understood that the material for forming the first package layer 28 may be the same or different from the material for forming the encapsulation layer 25.

Also, an underfill 262 can also be firstly formed between the second electronic elements 26 and the circuit structure 20 to cover the conductive bumps 26a, and then the first package layer 28 can be formed to cover the underfill 262 and the plurality of second electronic elements 26.

Figure 2F:
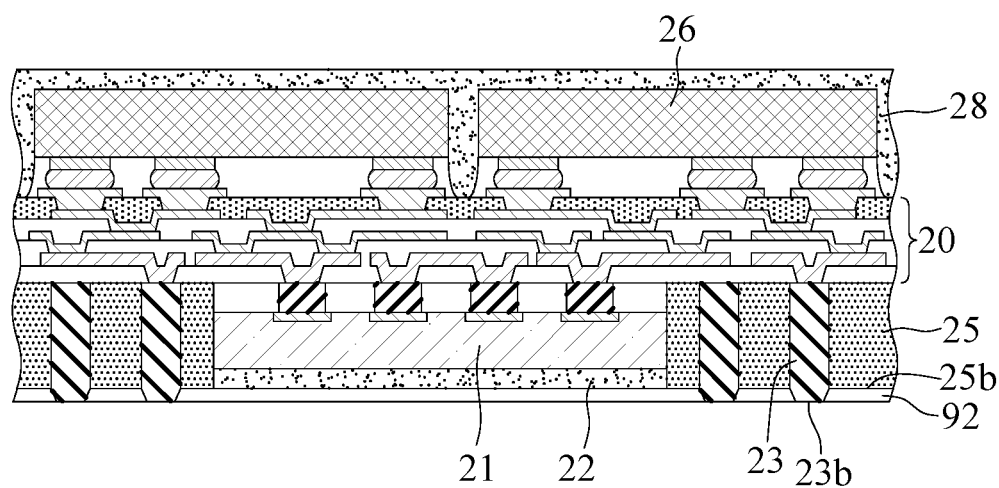

As shown in FIG. 2F, the carrier 9 and the release layer 90 thereon are removed, then the metal layer 91 is removed, and the insulating layer 92 is retained, so as to expose another end surface 23b of each of the conductive pillars 23.

In an embodiment, when the release layer 90 is peeled off, the metal layer 91 is used as a barrier to prevent damaging the insulating layer 92; and after the carrier 9 and the release layer 90 thereon are removed, the metal layer 91 is removed by etching, so that the end surfaces 23b of the conductive pillars 23 are exposed from a surface of the insulating layer 92.

Figure 2G:
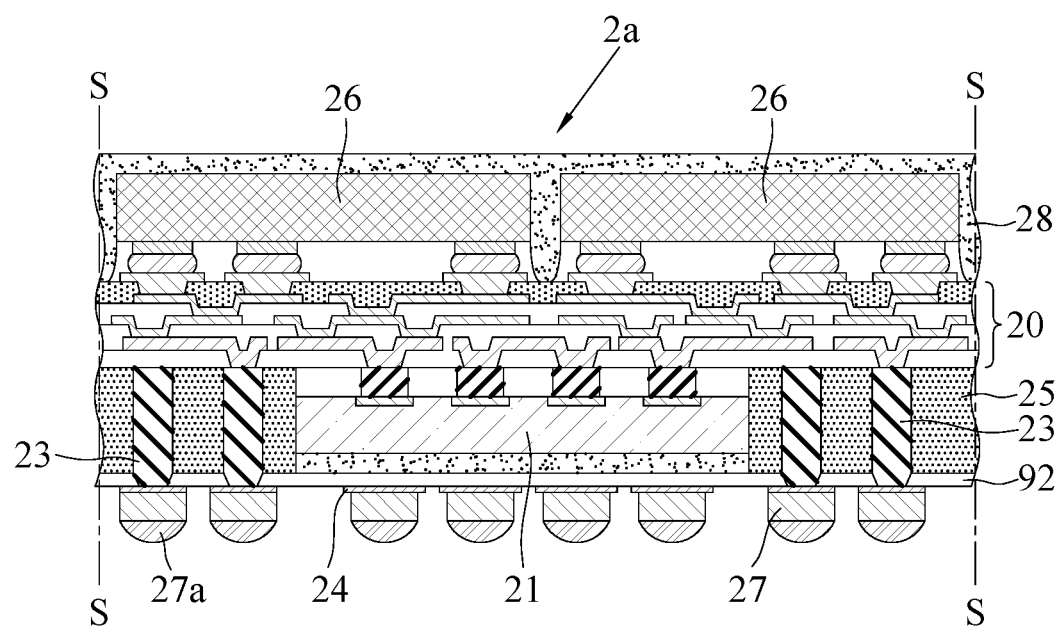

As shown in FIG. 2G, a plurality of conductive elements 27 containing a solder material 27a are formed on the insulating layer 92 to form a FO-EB type electronic module 2a, and some of the plurality of conductive elements 27 are electrically connected to the plurality of conductive pillars 23.

In an embodiment, a routing process is performed on the insulating layer 92, for example, a routing layer 24 is formed on the insulating layer 92 for bonding the conductive elements 27. It should be understood that when the number of contacts (IOs) of the electronic module 2a is insufficient (for example, the number of the conductive elements 27 cannot meet the product requirements), the RDL process can still be used to carry out the build-up process to reconfigure the number of IOs and their locations.

Figure 2H:
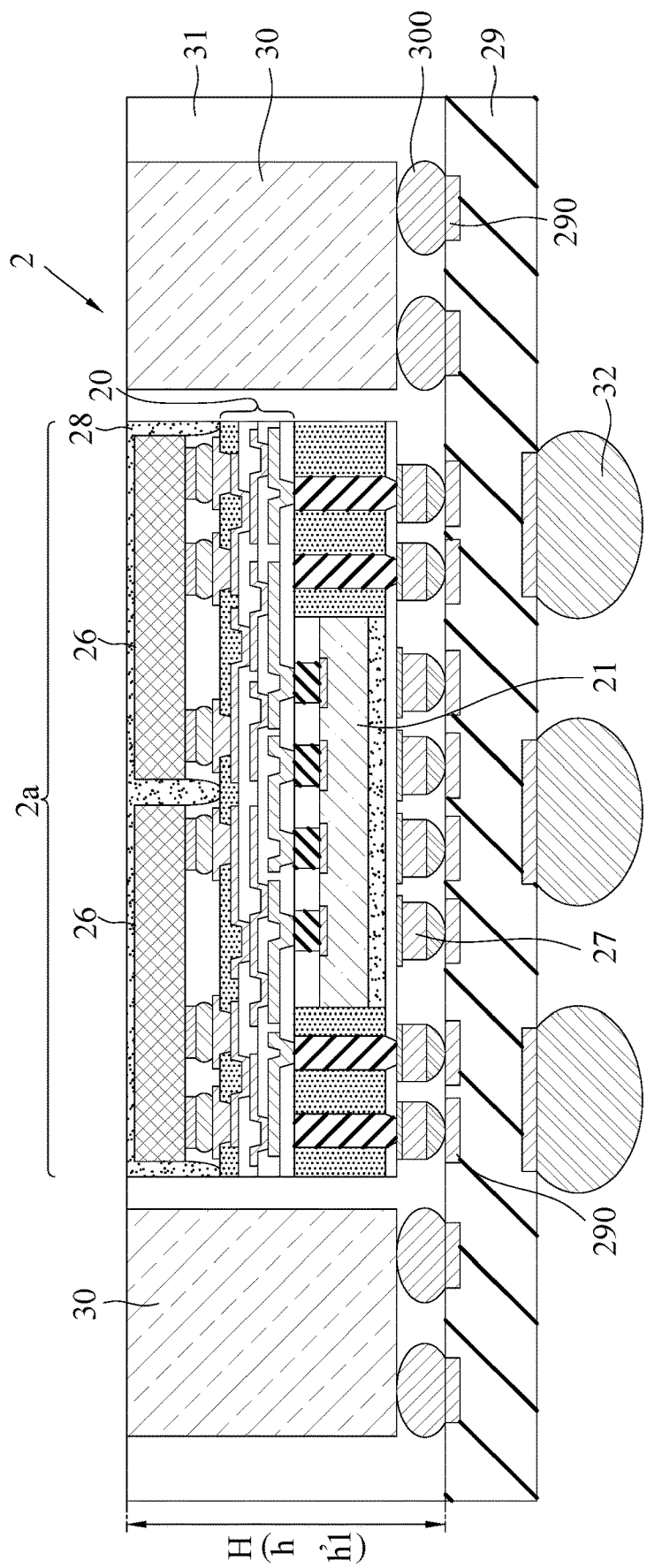

As shown in FIG. 2H, a singulation process is performed along cutting paths S shown in FIG. 2G to obtain a plurality of the electronic modules 2a, and then the electronic modules 2a are disposed on a substrate structure 29 having a circuit layer 290 via the conductive elements 27, so that the electronic modules 2a are electrically connected to the circuit layer 290, and at least one support member 30 is disposed on the substrate structure 29 to form the electronic package 2.

In an embodiment, the at least one support member 30 is an active element, such as a semiconductor chip, which is disposed on the substrate structure 29 in a flip-chip manner via a plurality of conductive bumps 300 to electrically connect to the circuit layer 290 of the substrate structure 29, and a second package layer 31 can be formed on the substrate structure 29 to cover the at least one support member 30 and the electronic module 2a, wherein the second package layer 31 is an insulating material, such as polyimide (PI), dry film, encapsulant such as epoxy resin, or molding compound, the second package layer 31 can be formed on the substrate structure 29 by lamination or molding, and the hardness of the first package layer 28 is greater than the hardness of the second package layer 31. It should be understood that the material for forming the first package layer 28 may be the same or different from the material for forming the second package layer 31.

Figure 3A:
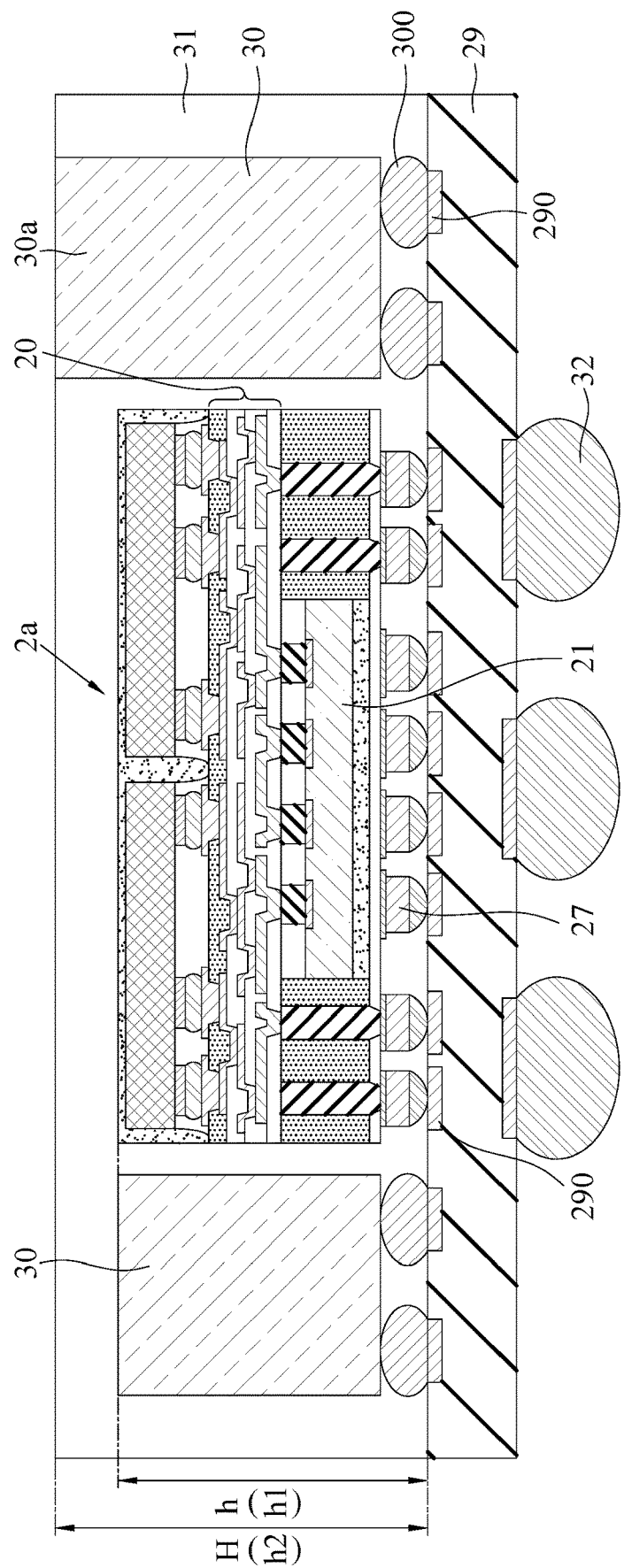
FIG. 3A to FIG. 3C are schematic cross-sectional views showing other different embodiments of FIG. 2H.
Figure 3B:
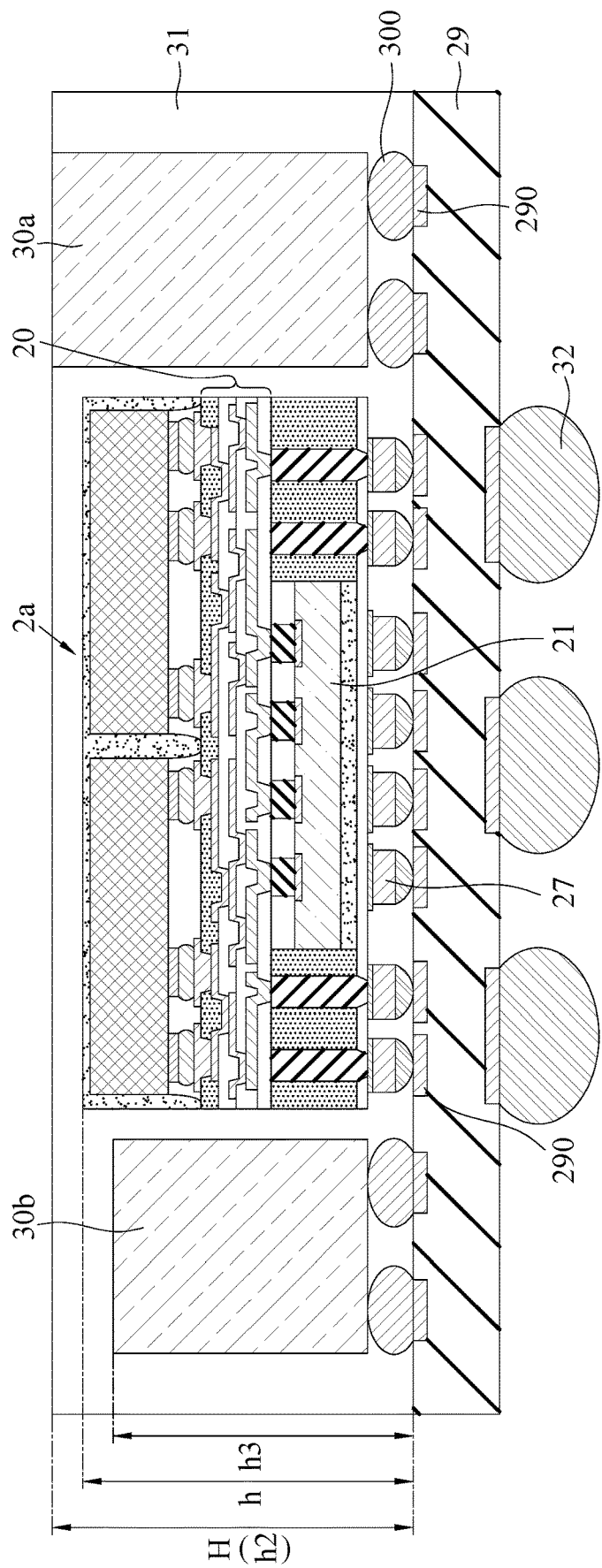
Figure 3C:
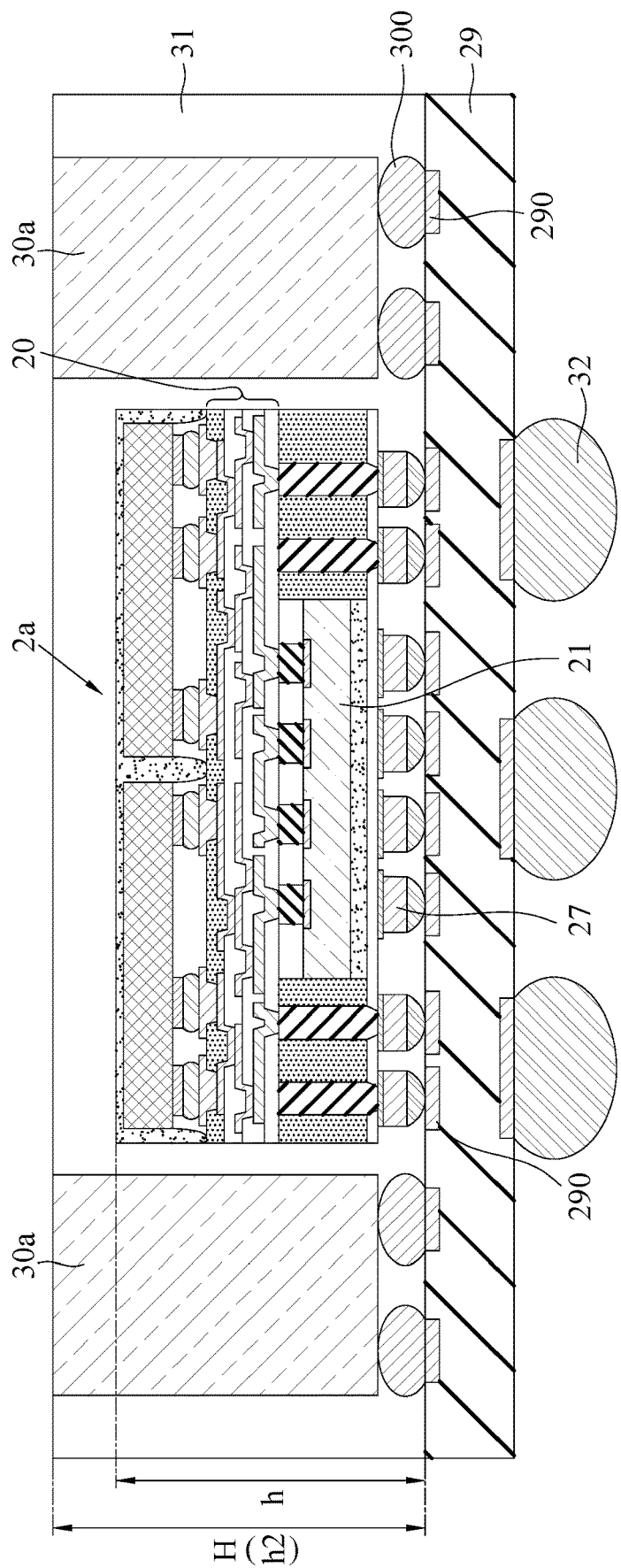

Furthermore, as shown in FIG. 2H, a height h1 of the at least one support member 30 relative to the substrate structure 29 is equal to a height H of the second package layer 31 relative to the substrate structure 29 (or as shown in FIG. 3A and FIG. 3C, at least one support member 30a and the second package layer 31 have the same height, i.e., a height h2 of the at least one support member 30a relative to the substrate structure 29 and the height H of the second package layer 31 relative to the substrate structure 29 are the same), so that the at least one support member 30 is exposed from the second package layer 31. Alternatively, as shown in FIG. 3A, the height h1 of the at least one support member 30 relative to the substrate structure 29 is less than the height H of the second package layer 31 relative to the substrate structure 29.

In addition, as shown in FIG. 2H and FIG. 3A, the height h1 of the at least one support member 30 relative to the substrate structure 29 is equal to a height h of the electronic module 2a relative to the substrate structure 29. Or as shown in FIG. 3A, FIG. 3B and FIG. 3C, the height h2 of the at least one support member 30a relative to the substrate structure 29 is greater than the height h of the electronic module 2a relative to the substrate structure 29. Alternatively, as shown in FIG. 3B, a height h3 of at least one support member 30b relative to the substrate structure 29 is less than the height h of the electronic module 2a relative to the substrate structure 29.

Figure 2I:
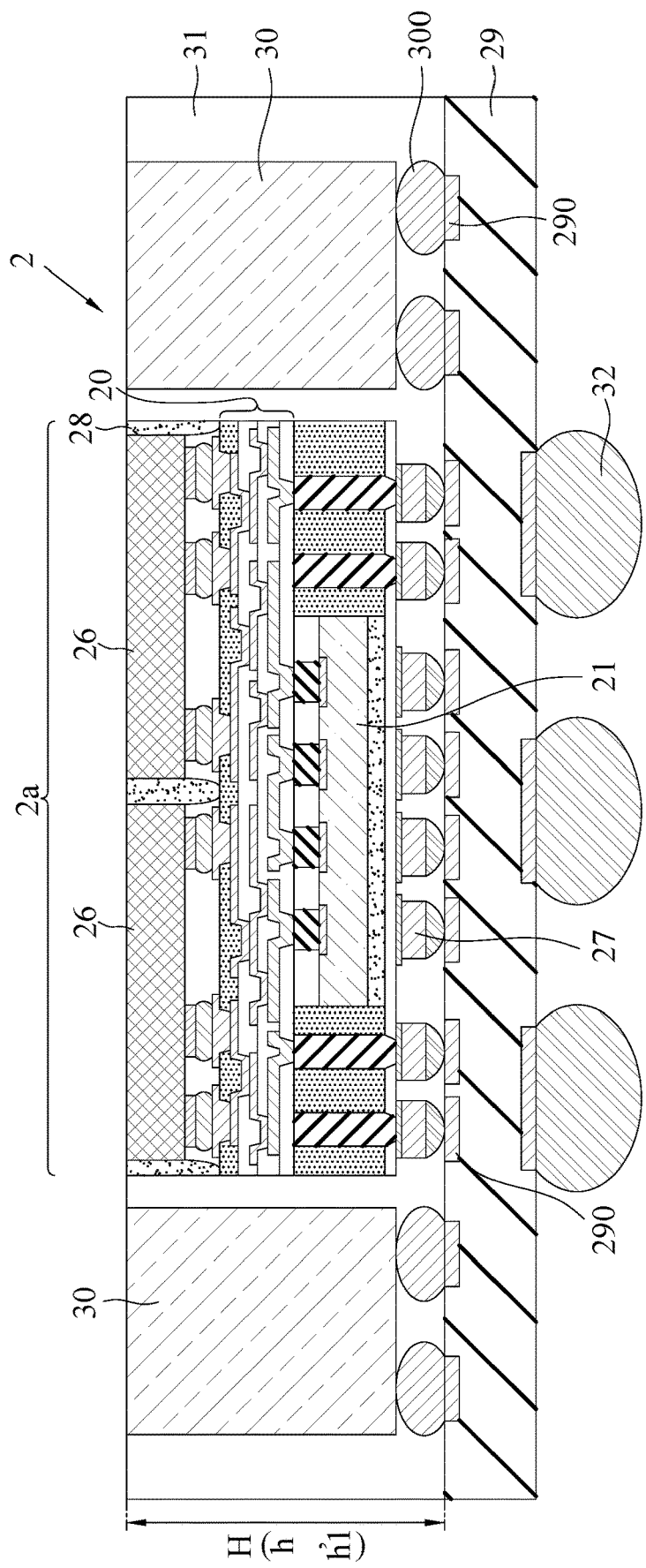
FIG. 2I is a schematic cross-sectional view showing another embodiment of FIG. 2H.

Moreover, before performing the singulation process, a part of the material of the first package layer 28 can be removed by a leveling process such as grinding, so that an upper surface of the first package layer 28 is flush with upper surfaces of the second electronic elements 26, as shown in FIG. 2I, such that the second electronic elements 26 are exposed from the first package layer 28. Further, a part of the material of the second package layer 31 can be removed by a leveling process, so that an upper surface of the second package layer 31 is flush with the upper surfaces of the second electronic elements 26, as shown in FIG. 2I, such that the second electronic elements 26 are exposed from the second package layer 31. It should be understood that in FIG. 3A to FIG. 3C, the upper surface of the first package layer 28 can also be flush with the upper surfaces of the second electronic elements 26, so that the second electronic elements 26 are exposed from the first package layer 28.

Also, a ball placement process is performed on a lower side of the substrate structure 29 to form a plurality of solder balls 32, so that the electronic package 2 can be disposed on a circuit board (not shown) in a subsequent process.

Therefore, in the manufacturing method of the present disclosure, at least one support member 30 is disposed on the substrate structure 29 to disperse the stress on the substrate structure 29 and eliminate the problem of stress concentration. Therefore, compared with the prior art, the electronic package 2 of the present disclosure can prevent the substrate structure 29 from warping, thereby avoiding reliability problems such as poor ball placement (e.g., the solder balls 32 are dropped and electrically disconnected), etc.

The present disclosure further provides an electronic package 2, which comprises: a substrate structure 29 having a circuit layer 290, an electronic module 2a and at least one support member 30, 30a, 30b.

The electronic module 2a is disposed on the substrate structure 29 and electrically connected to the circuit layer 290.

The support members 30, 30a, 30b are disposed on the substrate structure 29 and electrically connected to the circuit layer 290, and the support members 30, 30a, 30b are located around the electronic module 2a (e.g., the support members 30, 30a, 30b are located at a periphery of the electronic module 2a).

In one embodiment, the support members 30, 30a, 30b are active elements.

In one embodiment, the electronic module 2a comprises a first package layer 28, and a second package layer 31 is formed on the substrate structure 29 to cover the support members 30, 30a, 30b and the electronic module 2a, such that the hardness of the first package layer 28 is greater than the hardness of the second package layer 31.

In one embodiment, the electronic package 2 further comprises the second package layer 31 formed on the substrate structure 29 to cover the support members 30, 30a, 30b and the electronic module 2a. For example, the height of the support members 30, 30a is equal to the height of the second package layer 31. Alternatively, a height h1 of the at least one support member 30 relative to the substrate structure 29 is less than a height H of the second package layer 31 relative to the substrate structure 29.

In one embodiment, the height h1 of the at least one support member 30 relative to the substrate structure 29 is equal to a height h of the electronic module 2a relative to the substrate structure 29 (as shown in FIG. 2H and FIG. 3A).

In one embodiment, a height h2 of the at least one support member 30a relative to the substrate structure 29 is greater than the height h of the electronic module 2a relative to the substrate structure 29 (as shown in FIG. 3A, FIG. 3B and FIG. 3C).

In one embodiment, a height h3 of the at least one support member 30b relative to the substrate structure 29 is less than the height h of the electronic module 2a relative to the substrate structure 29 (as shown in FIG. 3B).

In one embodiment, the electronic module 2a comprises a bridge element (a first electronic element 21) and a plurality of second electronic elements 26 electrically connected to each other by the bridge element.

In view of the above, in the electronic package and manufacturing method thereof according to the present disclosure, the stress on the substrate structure is dispersed by configuring the support members to eliminate the problem of stress concentration. Therefore, compared with the prior art, the electronic package of the present disclosure can prevent the substrate structure from warping.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. An electronic package, comprising:
   a substrate structure having a circuit layer;
   an electronic module disposed on the substrate structure and electrically connected to the circuit layer, wherein the electronic module comprises a first package layer;
   at least one support member disposed on the substrate structure and located at a periphery of the electronic module, wherein the at least one support member is electrically connected to the circuit layer; and
   a second package layer formed on the substrate structure to cover the at least one support member and the electronic module, wherein a hardness of the first package layer is greater than a hardness of the second package layer.

2. The electronic package of claim 1, wherein the at least one support member is an active element.

3. The electronic package of claim 1, wherein the at least one support member has a height equal to that of the second package layer.

4. The electronic package of claim 1, wherein a height of the at least one support member relative to the substrate structure is less than a height of the second package layer relative to the substrate structure.

5. The electronic package of claim 1, wherein a height of the at least one support member relative to the substrate structure is equal to a height of the electronic module relative to the substrate structure.

6. The electronic package of claim 1, wherein a height of the at least one support member relative to the substrate structure is greater than a height of the electronic module relative to the substrate structure.

7. The electronic package of claim 1, wherein a height of the at least one support member relative to the substrate structure is less than a height of the electronic module relative to the substrate structure.

8. The electronic package of claim 1, wherein the electronic module comprises a bridge element, and a plurality of electronic elements are electrically connected to each other via the bridge element.

9. A method of manufacturing an electronic package, comprising:
   providing an electronic module and at least one support member, wherein the electronic module comprises a first package layer;
   disposing the electronic module and the at least one support member on a substrate structure having a circuit layer, wherein the electronic module is electrically connected to the circuit layer, and wherein the at least one support member is electrically connected to the circuit layer and located at a periphery of the electronic module; and
   forming a second package layer on the substrate structure to cover the at least one support member and the electronic module, wherein a hardness of the first package layer is greater than a hardness of the second package layer.

10. The method of claim 9, wherein the at least one support member is an active element.

11. The method of claim 9, wherein the at least one support member has a height equal to that of the second package layer.

12. The method of claim 9, wherein a height of the at least one support member relative to the substrate structure is less than a height of the second package layer relative to the substrate structure.

13. The method of claim 9, wherein a height of the at least one support member relative to the substrate structure is equal to a height of the electronic module relative to the substrate structure.

14. The method of claim 9, wherein a height of the at least one support member relative to the substrate structure is greater than a height of the electronic module relative to the substrate structure.

15. The method of claim 9, wherein a height of the at least one support member relative to the substrate structure is less than a height of the electronic module relative to the substrate structure.

16. The method of claim 9, wherein the electronic module comprises a bridge element, and a plurality of electronic elements are electrically connected to each other via the bridge element.

* * * * *